(12) United States Patent
Forbes et al.

(10) Patent No.: US 7,271,437 B2
(45) Date of Patent: Sep. 18, 2007

(54) NON-VOLATILE MEMORY WITH HOLE TRAPPING BARRIER

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 11/167,543

(22) Filed: Jun. 27, 2005

(65) Prior Publication Data

US 2006/0289927 A1    Dec. 28, 2006

(51) Int. Cl.
*H01L 29/76* (2006.01)
*H01L 21/336* (2006.01)

(52) U.S. Cl. .................. 257/314; 257/315; 257/324; 438/261; 438/263; 438/287; 438/288

(58) Field of Classification Search ............... 438/261, 438/263, 287, 288; 257/314, 315, 324, 327
See application file for complete search history.

(56) References Cited

U.S. PATENT DOCUMENTS

| | | | |
|---|---|---|---|
| 6,674,667 B2 | 1/2004 | Forbes | |
| 6,903,407 B1* | 6/2005 | Kang | 257/315 |
| 2005/0190606 A1* | 9/2005 | Houdt et al. | 365/185.28 |

OTHER PUBLICATIONS

Eitan, Boaz , et al., "NROM: A Novel Localized Trapped, 2-Bit Nonvolatile Memory Cell", *IEEE Electron Device Letters*, 21(11), (Nov. 2000), 543-545.

Fischetti, M. V., et al., "The effect of gate metal and SiO2 thickness on the generation of donor states at the Si-SiO2 interface", *Journal of Applied Physics*, 57(2), (Jan. 1985), 418-424.

Han, K. M., et al., "Sequential substrate and channel hot electron injection to separate oxide and interface traps in n-MOSTs", *Solid-State Electronics*, vol. 38, No. 1, (1995), 105-113.

Liu, C. T., et al., "A New Mode of Hot Carrier Degradation in 0.18um CMOS Technologies", *1998 Symposium on VLSI Technology Digest of Technical Papers*, (1998), 176-177.

Lusky, Eli , et al., "Characterization of Channel Hot Electron Injection by the Subthreshold Slope of NROM Device", *IEEE Electron Device Letters*, 22(11), (Nov. 2001), 556-558.

Maayan, Eduardo , et al., "A 512Mb NROM Flash Data Storage Memory with 8MB/s Data Rate", *Solid-State Circuits Conference, 2002. Digest of Technical Papers. ISSCC*, (2002), 100-101.

Neugroschel, Arnost , et al., "Direct-Current Measurements of Oxide and Interface Traps on Oxidized Silicon", *IEEE Transactions on Electron Devices*, vol. 42, No. 9, (1995), 1657-1662.

(Continued)

*Primary Examiner*—Hsien-Ming Lee
(74) *Attorney, Agent, or Firm*—Schwegman, Lundberg, Woessner, P.A.

(57) ABSTRACT

A non-volatile memory is described having memory cells with a gate dielectric. The gate dielectric is a multilayer charge trapping dielectric between a control gate and a channel region of a transistor to trap positively charged holes. The multilayer charge trapping dielectric comprises two layers of dielectric having different band gaps such that holes are trapped at a barrier between the two layers.

40 Claims, 1 Drawing Sheet

OTHER PUBLICATIONS

Ning, T. H., "Capture cross section and trap concentration of holes in silicon dioxide", *Journal of Applied Physics*, 47(3), (Mar. 1976), 1079-1081.

Ning, T. H., et al., "Completely electrically reprogrammable nonvolatile memory device using conventional p-channel MOSFET", *IBM Technical Disclosure Bulletin*, vol. 20, No. 5, (Oct. 1977),2016.

Ning, T. H., et al., "Erasable nonvolatile memory device using hole trapping in SiO2", *IBM Technical Disclosure Bulletin*, vol. 18, No. 8, (Jan. 1976), 2740-2742.

Nishida, Toshikazu , "BiMOS and SMOSC structures for MOS parameter measurement", *Solid-State Electronics*, vol. 35, No. 3, (Mar. 1992), 357-369.

Robertson, J. , "High dielectric constant oxides", *Eur. Phys. J. Appl. Phys.*, vol. 28, (2004), 265-291.

Samanta, Piyas , et al., "Coupled charge trapping dynamics in thin SiO2 gate oxide under Fowler-Nordheim stress at low electron fluence", *Journal of Applied Physics*, 83(5), (Mar. 1998), 2662-2669.

US 6,859,396, 02/2005, Forbes (withdrawn)

* cited by examiner

NON-VOLATILE MEMORY WITH HOLE TRAPPING BARRIER

FIELD OF THE INVENTION

The present invention relates to non-volatile memory devices, and more particularly to hole trapping memory devices.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor), which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells," each of which traditionally stores one or more bits of information.

A flash cell is similar to a standard Metal Oxide Semiconductor Field Effect Transistor (MOSFET) transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current is sensed and translated into 1's and 0's, reproducing the stored data.

A different non-volatile memory, Nitrided Read Only Memory (NROM), utilizes inherent physical features of an oxide-nitride-oxide (ONO) gate dielectric and known mechanisms of program and erase operations to create two separate physical bits per cell. The NROM cell is based on localized negative charge trapping. The cell is an n-channel MOSFET device where the gate dielectric is replaced by an ONO stack. Two spatially separated narrow charge distributions are stored in the nitride layer above junction edges. The NROM cell is programmed by channel hot electron injection.

The NROM memory devices have attracted much attention due to their advantages over the traditional floating-gate flash device, including lower programming voltage, better scalability, and improved cycling endurance. An advantage of the NROM cell is the negligible vertical retention loss due to inhibition of direct tunneling. Further, in floating gate technology the electron charge is stored in a conductive layer, and any minor oxide defect or oxide trapped charge under the gate might cause leakage and loss of all the stored charge. NROM technology, however, uses a nitride insulator as a retaining material, hence only a large defect in the oxide (comparable to the cell size) could degrade retention.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice as is well known in the art.

Relative terms such as above, below, lateral and adjacent are not limited to a specific coordinate system. These terms are used to describe relative positions between components and are not intended to be limitations. As such, additional components can be positioned between components that are above, below, lateral and adjacent to each other. Further, the figures are provided to help facilitate an understanding of the detailed description, are not intended to be accurate in scale, and have been simplified.

The following detailed description is, therefore, not to be taken in a limiting sense, and the scope of the present invention is defined only by the appended claims, along with the full scope of equivalents to which such claims are entitled.

Figure 1:
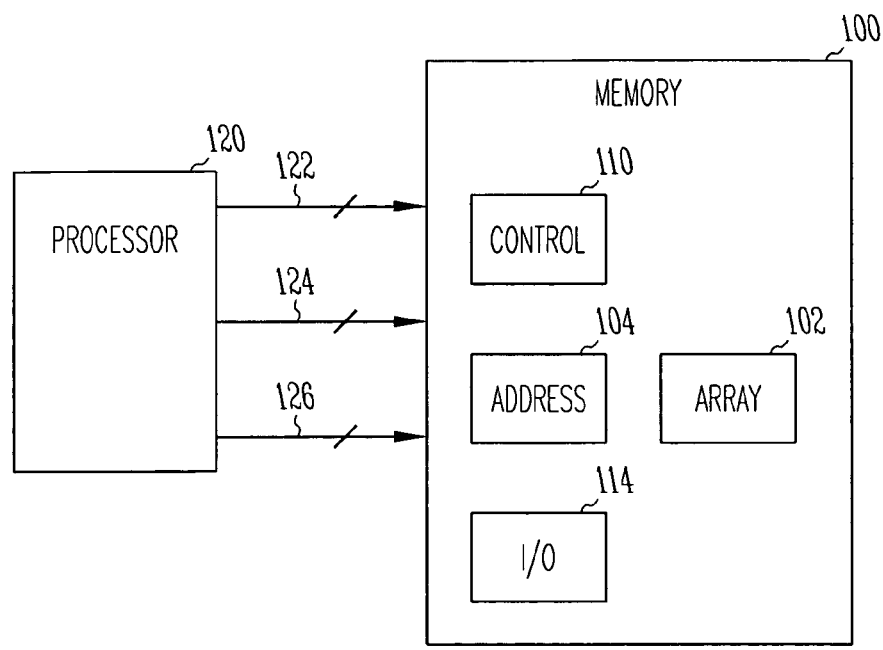
FIG. 1 is a block diagram of a memory according to one embodiment of the invention.

FIG. 1 is a simplified block diagram of an integrated circuit memory device 100 in accordance with an embodiment of the invention. The memory device 100 includes an array of non-volatile memory cells 102, address circuitry 104, control circuitry 110, and Input/Output (I/O) circuitry 114.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

In embodiments of the invention, a p-channel MOSFET with a double layered high dielectric constant, high-K, gate insulator with hole trapping at an interface between the two layers of the gate insulator is provided as a memory device.

For purposes of simplicity, control circuitry 110 is referred to herein as encompassing program circuitry to program a multilayer charge trapping dielectric by injecting holes into the dielectric.

Flash memories based on p-channel MOSFETs using hole trapping in gate oxides as a memory technique and hot hole injection are known. Further, hole trapping has been described for use in fuses and anti-fuse devices. In such memories and structures, holes from a silicon substrate are generated by large negative gate voltages, hot hole injection from the channel, or by light.

It is known that a sufficiently large negative gate bias voltage can be applied to cause tunnel electrons from the gate to gain enough energy to exceed the band gap energy of the gate insulator. As a result, energetic hole-electron pairs are generated in the silicon substrate and the holes have enough energy to overcome the barrier at the insulator and substrate interface.

The holes are then injected from the substrate into the gate dielectric, where they remain trapped. A large shift in the threshold voltage of the p-channel MOSFET results. The device can subsequently be reset by applying a positive gate bias voltage. It is known in the art that the positive charge generated in gate oxides by hot hole injection can be erased by avalanche electron injection.

Regardless of the programming method employed, embodiments of the present invention use a high-K (high dielectric constant) dielectric in the gate dielectric to trap positive charged holes. For the present embodiments, high-K dielectrics are defined as those with a dielectric constant greater than that of silicon nitride (i.e., >k=7).

Figure 2:
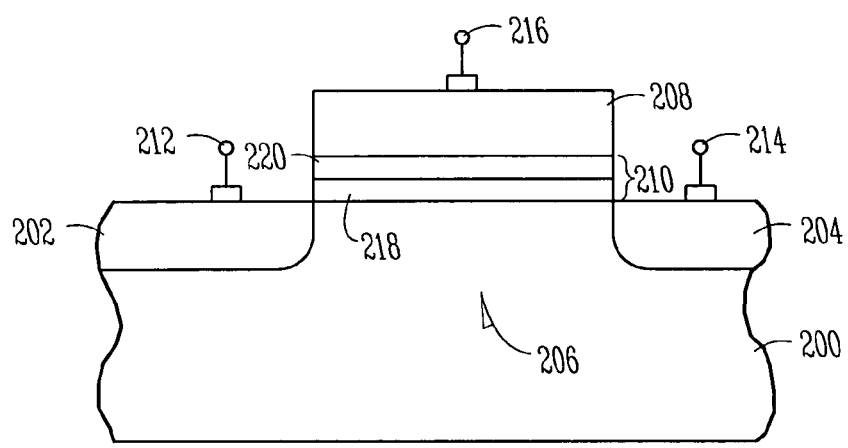
FIG. 2 is a cross-section of a transistor of one embodiment with a multi-layered dielectric.

FIG. 2 depicts a simplified cross-section of a metal oxide semiconductor field effect transistor (MOSFET) memory cell of the present invention. The memory cell is formed in a substrate 200. The cell includes a source region 202, a drain region 204, and a channel region 206 in the substrate 200 between the source region 202 and the drain region 204. A gate 208 is separated from the channel region 206 by a multi-layer gate dielectric 210. The dielectric layers include two layers of dielectric material 218 and 220. The layers have different band gaps. The dielectric 218 with the lower band gap is located adjacent to the transistor channel region.

A source line 212 is coupled to the source region 202. In a memory device, a bit line conductor 214 is coupled to the drain region 204. A word line conductor 216 is coupled to the gate 208.

One or more of the dual layer dielectric layers can be a high-K dielectric. These high-K dielectrics can be composite layers, or nanolaminates, formed by oxidation, chemical vapor deposition (CVD), evaporation, or atomic layer deposition (ALD), depending on the material used. The band gap energy of high-K dielectrics becomes smaller as the dielectric constant increases.

Example dielectrics of the present invention gate dielectric include a top dielectric or $SiO_2$ or $Al_2O_3$ in combination with a bottom dielectric selected from the group $Si_3N4$, $HfO_2$, $ZrO_2$, $La_2O_3$, $HfSiO_4$, $ZrSiO_4$ and $Y_2O_3$. Alternatively, the top dielectric layer can be selected from the group $Si_3N_4$, $HfO_2$, $ZrO_2$, $La_2O_3$, $HfSiO_4$, $ZrSiO_4$ and $Y_2O_3$, and the bottom dielectric is selected from $Ta_2O_5$ and $TiO_2$. The above listed dielectrics are not exhaustive and other dielectrics can be used.

The dual dielectric gate insulator is fabricated with a lower band gap material adjacent to the silicon substrate of the channel region. This creates a barrier at the center of the gate insulator for holes injected into the gate. Programming can be accomplished by applying a negative gate voltage, causing electrons to tunnel through the insulator adjacent to the gate. If the applied voltage exceeds the band gap energy of the lower band gap dielectric, electron hole pairs are created at the silicon interface. The holes will have enough energy to be injected into the lower dielectric layer but not enough to overcome the barrier at the center of the gate insulator. The holes, therefore, are trapped at the interior interface.

The invention claimed is:

1. A non-volatile memory comprising:
   source and drain regions located in a transistor body region, the source and drain regions are laterally spaced apart to form a channel region therebetween;
   a control gate isolated from and located vertically above the channel region; and
   a dual layer dielectric between the control gate and the channel region, wherein the dual layer dielectric comprises a first dielectric layer adjacent to the control gate and a second dielectric layer adjacent to the channel region, the first dielectric layer has a band gap greater than a band gap of the second dielectric layer such that positively charged holes are trapped at an interface between the first and second dielectric layers during programming, wherein the first dielectric layer is in contact with the second dielectric layer.

2. The non-volatile memory of claim 1 wherein the first dielectric layer is either $SiO_2$ or $Al_2O_3$.

3. The non-volatile memory of claim 1 wherein the first dielectric layer is selected from the group consisting of $Si_3N4$, $HfO_2$, $ZrO_2$, $La_2O_3$, $HfSiO_4$, $ZrSiO_4$ and $Y_2O_3$.

4. A non-volatile memory comprising:
   source and drain regions located in a transistor body region, the source and drain regions are laterally spaced apart to form a channel region therebetween;
   a control gate isolated from and located vertically above the channel region; and a dual layer dielectric between the control gate and the channel region, wherein the dual layer dielectric comprises a first dielectric layer adjacent to the control gate and a second dielectric layer adjacent to the channel region, the first dielectric layer has a band gap greater than a band gap of the second dielectric layer such that positively charged holes are trapped at an interface between the first and second dielectric layers during programming, wherein the second dielectric layer is selected from the group consisting of $Si_3N4$, $HfO_2$, $ZrO_2$, $La_2O_3$, $HfSiO_4$, $ZrSiO_4$ and $Y_2O_3$.

5. The non-volatile memory of claim 4, wherein the first dielectric layer is either $SiO_2$ or $Al_2O_3$.

6. The non-volatile memory of claim 4, wherein the first dielectric layer is selected from the group consisting of $Si_3N_4$, $HfO_2$, $ZrO_2$, $La_2O_3$, $HfSiO_4$, $ZrSiO_4$ and $Y_2O_3$.

7. The non-volatile memory of claim 4, wherein the first dielectric layer includes hafnium.

8. The non-volatile memory of claim 4, wherein the first dielectric layer is in contact with the second dielectric layer.

9. A non-volatile memory comprising:
source and drain regions located in a transistor body region, the source and drain regions are laterally spaced apart to form a channel region therebetween;
a control gate isolated from and located vertically above the channel region; and a dual layer dielectric between the control gate and the channel region, wherein the dual layer dielectric comprises a first dielectric layer adjacent to the control gate and a second dielectric layer adjacent to the channel region, the first dielectric layer has a band gap greater than a band gap of the second dielectric layer such that positively charged holes are trapped at an interface between the first and second dielectric layers during programming, wherein the second dielectric layer is selected from the group consisting of $Ta_2O_5$ and $TiO_2$.

10. The non-volatile memory of claim 9, wherein the first dielectric layer is selected from the group consisting of $HfO_2$ and $HfSiO_4$.

11. The non-volatile memory of claim 9, wherein the first dielectric layer is selected from the group consisting of $ZrO_2$ and $ZrSiO_4$.

12. The non-volatile memory of claim 9, wherein the first dielectric layer includes $La_2O_3$.

13. The non-volatile memory of claim 9, wherein the first dielectric layer is in contact with the second dielectric layer.

14. A non-volatile memory comprising:
source and drain regions located in a transistor body region, the source and drain regions are laterally spaced apart to form a channel region therebetween;
a control gate isolated from and located vertically above the channel region; and a dual layer dielectric between the control gate and the channel region, wherein the dual layer dielectric comprises a first dielectric layer adjacent to the control gate and a second dielectric layer adjacent to the channel region, the first dielectric layer has a band gap greater than a band gap of the second dielectric layer such that positively charged holes are trapped at an interface between the first and second dielectric layers during programming, wherein the first dielectric layer is selected from the group consisting of $Si_3N_4$, $HfO_2$, $ZrO_2$, $La_2O_3$, $HfSiO_4$, $ZrSiO_4$ and $Y_2O_3$, and wherein the second dielectric layer is selected from $Ta_2O_5$ and $TiO_2$.

15. The non-volatile memory of claim 14, wherein the first dielectric layer is adjacent to the second dielectric layer.

16. A non-volatile memory comprising:
source and drain regions located in a transistor body region, the source and drain regions are laterally spaced apart to form a channel region therebetween;
a control gate isolated from and located vertically above the channel region; and a dual layer dielectric between the control gate and the channel region, wherein the dual layer dielectric comprises a first dielectric layer adjacent to the control gate and a second dielectric layer adjacent to the channel region, the first dielectric layer has a band gap greater than a band gap of the second dielectric layer such that positively charged holes are trapped at an interface between the first and second dielectric layers during programming, wherein the first dielectric layer is either $SiO_2$ or $Al_2O_3$, and wherein the second dielectric layer is selected from the group consisting of $Si_3N_4$, $HfO_2$, $ZrO_2$, $La_2O_3$, $HfSiO_4$, $ZrSiO_4$ and $Y_2O_3$.

17. The non-volatile memory of claim 16, wherein the first dielectric layer is adjacent to the second dielectric layer.

18. A memory device comprising:
an array of positive charge hole trapping transistor memory cells, each memory cell comprises,
source and drain regions located in a transistor body region, the source and drain regions are laterally spaced apart to form a channel region therebetween,
a control gate isolated from and located vertically above the channel region,
and
a dual layer dielectric between the control gate and the channel region, wherein the dual layer dielectric comprises a first dielectric layer adjacent to the control gate and a second dielectric layer adjacent to the channel region, the first dielectric layer having a band gap greater than a band gap of the second dielectric layer such that positively charged holes are trapped at an interface between the first and second dielectric layers during programming, wherein the first dielectric layer is in contact with the second dielectric layer; and
write circuitry to write data to the memory cells during a write operation.

19. A memory device comprising:
an array of positive charge hole trapping transistor memory cells, each memory cell comprises,
source and drain regions located in a transistor body region, the source and drain regions are laterally spaced apart to form a channel region therebetween,
a control gate isolated from and located vertically above the channel region, and
a dual layer dielectric between the control gate and the channel region, wherein the dual layer dielectric comprises a first dielectric layer adjacent to the control gate and a second dielectric layer adjacent to the channel region, the first dielectric layer having a band gap greater than a band gap of the second dielectric layer such that positively charged holes are trapped at an interface between the first and second dielectric layers during programming, wherein the first dielectric layer is selected from the group consisting of $Si_3N_4$, $HfO_2$, $ZrO_2$, $La_2O_3$, $HfSiO_4$, $ZrSiO_4$ and $Y_2O_3$, and wherein the second dielectric layer is selected from the group consisting of $Ta_2O_5$ and $TiO_2$, and
write circuitry to write data to the memory cells during a write operation.

20. The memory device of claim 19 wherein the first dielectric layer is either $SiO_2$ or $Al_2O_3$, and wherein the second dielectric layer is selected from the group consisting of $Si_3N_4$, $HfO_2$, $ZrO_2$, $La_2O_3$, $HfSiO_4$, $ZrSiO_4$ and $Y_2O_3$.

21. The memory device of claim 19, wherein the first dielectric layer is in contact with the second dielectric layer.

22. A method of programming a non-volatile memory transistor comprising:
injecting positively charged holes into a multilayer dielectric located between a control gate and a channel region of the transistor, the multilayer dielectric comprises a first dielectric layer adjacent to the control gate and a second dielectric layer adjacent to the channel region, the first dielectric layer having a band gap greater than a band gap of the second dielectric layer; and trapping the positively charged holes in the second dielectric layer at an interface between the first and second dielectric layers.

23. The method of claim 22 wherein the injecting positively charged holes comprises generating holes at an interface of the first dielectric layer and the control gate by electrons tunneling off of the control gate.

24. A method of fabricating a memory cell transistor comprising:
forming a source region in a substrate;
forming a drain region in the substrate, wherein the source and drain regions are laterally spaced apart to define a channel region therebetween;
forming a first dielectric layer above the channel region, the first dielectric layer having a first band gap energy;
forming a second dielectric layer above and in contact with the first dielectric layer to form an interface between the second dielectric layer and the first dielectric layer, the second dielectric layer having a second band gap energy that is greater than the first band gap energy such that the interface is a charge trapping barrier; and
forming a control gate above the second dielectric layer.

25. The method of claim 24 wherein the first dielectric layer is either $SiO_2$ or $Al_2O_3$.

26. The method of claim 24 wherein the second dielectric layer is selected from the group consisting of $Si_3N_4$, $HfO_2$, $ZrO_2$, $La_2O_3$, $HfSiO_4$, $ZrSiO_4$ and $Y_2O_3$.

27. The method of claim 24 wherein the first dielectric layer is either $SiO_2$ or $Al_2O_3$, and wherein the second dielectric layer is selected from the group consisting of $Si_3N_4$, $HfO_2$, $ZrO_2$, $La_2O_3$, $HfSiO_4$, $ZrSiO_4$ and $Y_2O_3$.

28. A method of fabricating a memory cell transistor comprising:
forming a source region in a substrate;
forming a drain region in the substrate, wherein the source and drain regions are laterally spaced apart to define a channel region therebetween;
forming a first dielectric layer above the channel region, the first dielectric layer having a first band gap energy, wherein the first dielectric layer is selected from the group consisting of $Si_3N_4$, $HfO_2$, $ZrO_2$, $La_2O_3$, $HfSiO_4$, $ZrSiO_4$ and $Y_2O_3$;
forming a second dielectric layer above the first dielectric layer, the second dielectric layer having a second band gap energy that is greater than the first band gap energy; and
forming a control gate above the second dielectric layer.

29. The method of claim 28, wherein forming a second dielectric layer includes forming the second dielectric layer directly on the first dielectric layer to form an interface between the second dielectric layer and the first dielectric layer.

30. The method of claim 28, wherein forming a second dielectric layer includes forming the second dielectric layer with a second band gap energy that is greater than the first band gap energy such that a charge trapping barrier is formed between the second dielectric layer and the first dielectric layer.

31. A method of fabricating a memory cell transistor comprising:

forming a source region in a substrate;
forming a drain region in the substrate, wherein the source and drain regions are laterally spaced apart to define a channel region therebetween;
forming a first dielectric layer above the channel region, the first dielectric layer having a first band gap energy,
forming a second dielectric layer above the first dielectric layer, the second dielectric layer having a second band gap energy that is greater than the first band gap energy, wherein the second dielectric layer is selected from the group consisting of $Ta_2O_5$ and $TiO_2$; and
forming a control gate above the second dielectric layer.

32. The method of claim 31, wherein forming a second dielectric layer includes forming the second dielectric layer directly on the first dielectric layer to form an interface between the second dielectric layer and the first dielectric layer.

33. The method of claim 31, wherein forming a second dielectric layer includes forming the second dielectric layer with a second band gap energy that is greater than the first band gap energy such that a charge trapping barrier is formed between the second dielectric layer and the first dielectric layer.

34. A method of fabricating a memory cell transistor comprising:
forming a source region in a substrate;
forming a drain region in the substrate, wherein the source and drain regions are laterally spaced apart to define a channel region therebetween;
forming a first dielectric layer above the channel region, the first dielectric layer having a first band gap energy, wherein the first dielectric layer is selected from the group $Si_3N_4$, $HfO_2$, $ZrO_2$, $La_2O_3$, $HfSiO_4$, $ZrSiO_4$ and $Y_2O_3$,
forming a second dielectric layer above the first dielectric layer, the second dielectric layer having a second band gap energy that is greater than the first band gap energy, wherein the second dielectric layer is selected from the group consisting of $Ta_2O_5$ and $TiO_2$; and
forming a control gate above the second dielectric layer.

35. The method of claim 34, wherein forming a second dielectric layer includes forming the second dielectric layer in contact with the first dielectric layer to form an interface between the second dielectric layer and the first dielectric layer.

36. The method of claim 34, wherein forming a second dielectric layer includes forming the second dielectric layer with a second band gap energy that is greater than the first band gap energy such that a charge trapping barrier is formed between the second dielectric layer and the first dielectric layer.

37. A non-volatile memory, comprising:
source and drain regions located in a transistor body region, the source and drain regions are laterally spaced apart to form a channel region therebetween;
a control gate isolated from and located vertically above the channel region; and
a dual layer dielectric between the control gate and the channel region, wherein the dual layer, dielectric comprises a first dielectric layer adjacent to the control gate and a second dielectric layer adjacent to the channel region, the first dielectric layer has a band gap greater than a band gap of the second dielectric layer such that positively charged holes are trapped in the second dielectric layer at an interface between the first and second dielectric layers during programming.

38. The non-volatile memory of claim 37, wherein the first dielectric layer is in contact with the second dielectric layer.

39. The non-volatile memory of claim 37, wherein the first dielectric layer is selected from the group $Si_3N_4$, $HfO_2$, $ZrO_2$, $La_2O_3$, $HfSiO_4$, $ZrSiO_4$ and $Y_2O_3$.

40. The non-volatile memory of claim 37, wherein the second dielectric layer is selected from the group consisting of $Ta_2O_5$ and $TiO_2$.

* * * * *

UNITED STATES PATENT AND TRADEMARK OFFICE
CERTIFICATE OF CORRECTION

PATENT NO. : 7,271,437 B2  Page 1 of 1
APPLICATION NO. : 11/167543
DATED : September 18, 2007
INVENTOR(S) : Forbes et al.

It is certified that error appears in the above-identified patent and that said Letters Patent is hereby corrected as shown below:

On the title page, item (56), under "U.S. Patent Documents", in column 1, line 2, below "6,674,667 B2   1/2004 Forbes" insert -- 6,859,396   2/2005   Forbes --.

On the title page, item (56), under "Other Publications", in column 1, line 1, delete "Trapped," and insert -- Trapping, --, therefor.

In column 4, line 53, in Claim 3, delete "$Si_3N4$," and insert -- $Si_3N_4$, --, therefor.

In column 5, line 2, in Claim 4, delete "$Si_3N4$," and insert -- $Si_3N_4$, --, therefor.

In column 5, line 56, in Claim 14, after "selected from" insert -- the group consisting of --.

In column 8, line 33, in Claim 34, after "group" insert -- consisting of --.

In column 8, line 60, in Claim 37, after "layer" delete ",".

In column 9, line 5, in Claim 39, after "group" insert -- consisting of --.

Signed and Sealed this

Fourth Day of December, 2007

JON W. DUDAS
*Director of the United States Patent and Trademark Office*